(12) United States Patent
Xue et al.

(10) Patent No.: US 11,871,606 B2
(45) Date of Patent: Jan. 9, 2024

(54) DISPLAY SUBSTRATE AND DISPLAY DEVICE

(71) Applicant: BOE TECHNOLOGY GROUP CO., LTD., Beijing (CN)

(72) Inventors: Jinxiang Xue, Beijing (CN); Guoqiang Wang, Beijing (CN); Zhongyuan Sun, Beijing (CN); Wenqi Liu, Beijing (CN); Jingkai Ni, Beijing (CN); Kai Sui, Beijing (CN); Xiaofen Wang, Beijing (CN); Xiang Zhou, Beijing (CN); Chao Dong, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 455 days.

(21) Appl. No.: 17/279,872

(22) PCT Filed: Jul. 22, 2020

(86) PCT No.: PCT/CN2020/103622
§ 371 (c)(1),
(2) Date: Mar. 25, 2021

(87) PCT Pub. No.: WO2021/017986
PCT Pub. Date: Feb. 4, 2021

(65) Prior Publication Data
US 2022/0037621 A1    Feb. 3, 2022

(30) Foreign Application Priority Data
Jul. 29, 2019   (CN) .......................... 201910688029.6

(51) Int. Cl.
*H10K 50/84*     (2023.01)
*H10K 50/844*    (2023.01)
(Continued)

(52) U.S. Cl.
CPC ......... *H10K 50/844* (2023.02); *H10K 59/121* (2023.02); *H10K 59/131* (2023.02)

(58) Field of Classification Search
CPC .. H10K 50/844; H10K 59/121; H10K 59/131; H10K 2102/311; H10K 59/124; H10K 59/12
See application file for complete search history.

(56) References Cited

U.S. PATENT DOCUMENTS

| 10,396,308 B2 * | 8/2019 | Okigawa ................ H10K 71/00 |
| 11,653,524 B2 * | 5/2023 | Yoon .................... H10K 50/844 257/40 |

(Continued)

FOREIGN PATENT DOCUMENTS

| CN | 203883009 | 10/2014 |
| CN | 109103346 | 12/2018 |

(Continued)

OTHER PUBLICATIONS

PCT International Search Report (w/ English translation) for corresponding PCT Application No. PCT/CN2020/103622, dated Sep. 21, 2020, 7 pages.

(Continued)

*Primary Examiner* — S M Sohel Imtiaz
(74) *Attorney, Agent, or Firm* — Dority & Manning, P.A.

(57) ABSTRACT

A display substrate has at least one display region and at least one non-display region, and a non-display region is located at at least one side of a display region. The display substrate includes a base, a plurality of light-emitting devices, and an encapsulation layer. The plurality of light-emitting devices are located in the at least one display region and disposed on a side of the base. The encapsulation layer is disposed on a side of the plurality of light-emitting devices facing away from the base, and configured to encapsulate the plurality of light-emitting devices. A surface, proximate to (Continued)

the base, of a portion of the encapsulation layer located in the non-display region is unevenly arranged.

18 Claims, 9 Drawing Sheets

(51) Int. Cl.
*H10K 59/121* (2023.01)
*H10K 59/131* (2023.01)

(56) References Cited

U.S. PATENT DOCUMENTS

| | | | | |
|---|---|---|---|---|
| 2015/0303406 A1* | 10/2015 | Kim | ................... | H10K 50/844 |
| | | | | 257/40 |
| 2017/0069873 A1* | 3/2017 | Kim | ................... | H10K 59/88 |
| 2018/0159077 A1* | 6/2018 | Lee | ................... | H10K 59/12 |
| 2019/0221761 A1* | 7/2019 | Hwang | ................ | B32B 27/08 |
| 2019/0348632 A1 | 11/2019 | Wang et al. | | |
| 2020/0295299 A1* | 9/2020 | Yin | ................... | H10K 50/844 |
| 2020/0363895 A1* | 11/2020 | Shim | ................. | H10K 59/40 |
| 2020/0409419 A1 | 12/2020 | He et al. | | |
| 2021/0257434 A1 | 8/2021 | Xie et al. | | |

FOREIGN PATENT DOCUMENTS

| | | |
|---|---|---|
| CN | 109346624 | 2/2019 |
| CN | 109659444 | 4/2019 |
| CN | 109755412 | 5/2019 |
| CN | 109841660 | 6/2019 |
| CN | 110120463 | 8/2019 |
| CN | 110416266 | 11/2019 |

OTHER PUBLICATIONS

Chinese First Office Action (w/ English translation) for corresponding CN Application No. 201910688029.6, 24 pages.

* cited by examiner

DISPLAY SUBSTRATE AND DISPLAY DEVICE

CROSS-REFERENCE TO RELATED APPLICATIONS

This application is a national phase entry under 35 USC 371 of International Patent Application No. PCT/CN2020/103622, filed on Jul. 22, 2020, which claims priority to Chinese Patent Application No. 201910688029.6, filed on Jul. 29, 2019, which are incorporated herein by reference in their entirety.

TECHNICAL FIELD

The present disclosure relates to the field of display technologies, and in particular, to a display substrate and a display device.

BACKGROUND

With the development of display technologies, flexible display technology has been gradually applied to various industries. For example, stretchable display substrates are used in wearable display devices. Currently, light-emitting devices in the stretchable display substrates are generally organic light-emitting diodes (OLEDs). Since a light-emitting performance and service life of the light-emitting devices are easily affected by the external environment, an encapsulation layer needs to be provided in the stretchable display substrate to encapsulate the light-emitting devices.

SUMMARY

In one aspect, a display substrate is provided. The display substrate has display region(s) and non-display region(s), and a non-display region is located at at least one side of a display region. The display substrate includes a base, a plurality of light-emitting devices, and an encapsulation layer. The plurality of light-emitting devices are located in the display region(s) and disposed on a side of the base. The encapsulation layer is disposed on a side, facing away from the base, of the plurality of light-emitting devices, and configured to encapsulate the plurality of light-emitting devices. A surface, proximate to the base, of a portion of the encapsulation layer located in the non-display region is unevenly arranged.

In some embodiments, the display substrate further includes a dielectric layer. The dielectric layer is located in the non-display region(s), and is disposed between the base and the encapsulation layer.

In some examples, a surface, facing away from the base, of a portion of the dielectric layer located in the non-display region has a plurality of first grooves. The surface, proximate to the base, of portion of the encapsulation layer located in the non-display region has a plurality of first protrusions. The plurality of first protrusions are in one-to-one correspondence with the plurality of first grooves, and an orthogonal projection of each first protrusion on the base is located within an orthogonal projection of a corresponding first groove on the base.

In some embodiments, the display substrate has a plurality of pixel regions, and a non-pixel region located at at least one side of each pixel region. The plurality of pixel regions are arranged in an array, and each pixel region includes a display region and a non-display region. The non-pixel region includes a connection region and an opening region. The display substrate further includes a plurality of signal connection lines located in the connection region. The display substrate further includes a plurality of signal control lines located in each pixel region. At least one end of each signal connection line is connected to a corresponding signal control line in an adjacent pixel region. Portions, located in the opening regions, of the base, the encapsulation layer, and thin film(s) located between the base and the encapsulation layer are hollowed. Portions, located in the connection regions, of the encapsulation layer are located on a side, facing away from the base, of the plurality of signal connection lines.

In some embodiments, the non-display region is located between a display region in a same pixel region and a corresponding connection region. The display substrate further includes at least one barrier member located in the non-display region. The at least one barrier member is disposed on a side, proximate to the base, of the encapsulation layer, and is configured to block a deformation crack from propagating from the connection region to the display region in a case where the deformation crack appears in a portion, located in the connection region, of the encapsulation layer.

In some embodiments, the display substrate includes the dielectric layer. The surface, facing away from the base, of the portion of the dielectric layer located in the non-display region has a fixing groove configured to match with a barrier member in the at least one barrier member. The barrier member includes a first sub-portion and a second sub-portion that are connected along a direction perpendicular to a surface of the base facing the encapsulation layer. The first sub-portion is located in a corresponding fixing groove. The second sub-portion extends in a direction moving away from the first sub-portion, and a height of the second sub-portion in the direction perpendicular to the surface of the base facing the encapsulation layer is not less than a distance of a surface, facing away from the base, of the portion of the encapsulation layer located in the connection region from a surface of the second-portion proximate to the base in a same direction.

In some embodiments, an area of a cross-section of the second sub-portion taken along a plane parallel to the surface of the base facing the encapsulation layer gradually increases in a direction moving away from the base.

In some embodiments, a longitudinal section of the second sub-portion in a first direction is shaped as an inverted trapezoid, the first direction being a direction pointing from the non-display region to the connection region.

In some embodiments, the height of the second sub-portion in the direction perpendicular to the surface of the base facing the encapsulation layer is 2 μm to 4 μm.

In some embodiments, at least one barrier is a loop-shaped barrier member. An inner boundary of an orthogonal projection of the loop-shaped barrier member on the base is located outside of the display region.

In some embodiments, the display substrate includes the dielectric layer. The display substrate further includes at least one insulating layer. The at least one insulating layer is located between the dielectric layer and the base. Portions, located in the opening regions, of the at least one insulating layer are hollowed.

The display substrate further includes an etching protection layer. The etching protection layer is located between the dielectric layer and the encapsulation layer, and covers at least a surface, proximate to the encapsulation layer, of the dielectric layer. The etching protection layer is configured to protect a thin film located outside of the opening regions from being etched away during a process of hollowing out the opening regions.

In some embodiments, the dielectric layer has the first grooves. A surface, facing away from the base, of a portion of the etching protection layer located in the non-display region has a plurality of second grooves. The plurality of second grooves are in one-to-one correspondence with the plurality of first protrusions of the encapsulation layer, and each first protrusion is located in a corresponding second groove.

In some embodiments, the display substrate further includes a first signal line protection layer and a second signal line protection layer that are provided on both sides of the plurality of signal connection lines in a direction perpendicular to the surface of the base facing the encapsulation layer. The first signal line protection layer and the second signal line protection layer are both made of an organic material.

In some embodiments, the second signal line protection layer is located on a surface, proximate to the base, of the plurality of signal connection lines. The display substrate further includes a barrier layer located between the base and the second signal line protection layer. The barrier layer is made of an inorganic material. A thickness of a portion of the barrier layer located in the connection regions is less than a thickness of a portion of the barrier layer located in the pixel region.

In some embodiments, the portion, located in the connection region of the barrier layer has a third groove. The second signal line protection layer is located in the third groove. A depth of the third groove is less than or equal to the thickness of the portion of the barrier layer located in the pixel region.

In some embodiments, the display substrate further includes a base film. The base film is made of an elastic material. The base film is fixed on a surface of the base facing away from the encapsulation layer through an adhesive layer.

In some embodiments, each first protrusion of the encapsulation layer is located in a corresponding first groove.

In some embodiments, a depth of the first groove is 70% to 100% of a thickness of the dielectric layer.

In some embodiments, at least one of the first grooves is a loop-shaped groove, and the first protrusion corresponding to the loop-shaped groove is a loop-shaped protrusion.

In some embodiments, the dielectric layer is made of an insulating material.

In another aspect, a display device is provided. The display device includes the display substrate as described in some of the above embodiments.

BRIEF DESCRIPTION OF THE DRAWINGS

In order to describe technical solutions of the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on an actual size of a product, an actual process of a method and an actual timing of a signal involved in the embodiments of the present disclosure.

DETAILED DESCRIPTION

Figure 1:
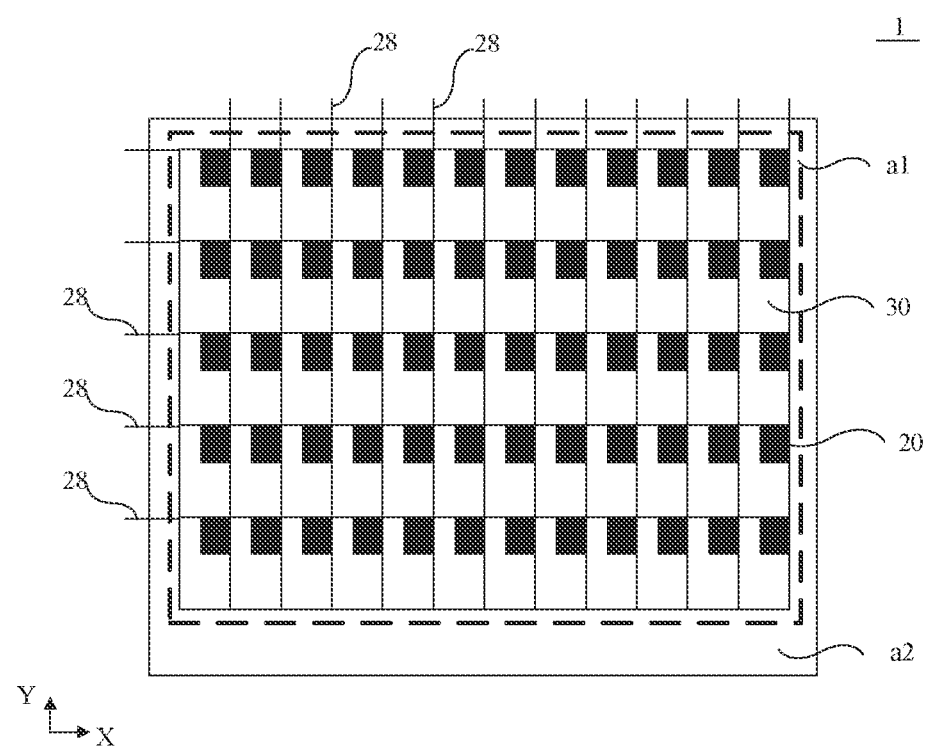
FIG. 1 is a schematic structural diagram of a display substrate according to some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art on a basis of the embodiments of the present disclosure shall be included in the protection scope of the present disclosure Unless the context requires otherwise, throughout the description and claims, the term "comprise" and other forms thereof such as the third-person singular form "comprises" and the present participle form "comprising" are construed as an open and inclusive meaning, i.e., "including, but not limited to." In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are used for descriptive purposes only, and are not to be construed as indicating or implying the relative importance or implicitly indicating the number of indicated technical features below. Thus, features defined with "first" and "second" may explicitly or implicitly include one or more of the features. In the description of the embodiments of the present disclosure, the term "a/the plurality of" means two or more unless otherwise specified.

In the description of some embodiments, expressions such as "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

"At least one of A, B, and C" has the same meaning as "at least one of A, B, or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of "applicable to" or "configured to" herein means an open and inclusive expression, which does not exclude devices applicable to or configured to perform additional tasks or steps.

Exemplary embodiments are described herein with reference to sectional views and/or plan views as idealized exemplary drawings. In the accompanying drawings, thicknesses of layers and sizes of regions are enlarged for clarity. Thus, variations in shapes relative to the accompanying drawings due to, for example, manufacturing techniques and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a curved feature. Therefore, regions shown in the accompanying drawings are schematic in nature and their shapes are not intended to show actual shapes of the regions in a device and are not intended to limit the scope of the exemplary embodiments.

Figure 17:
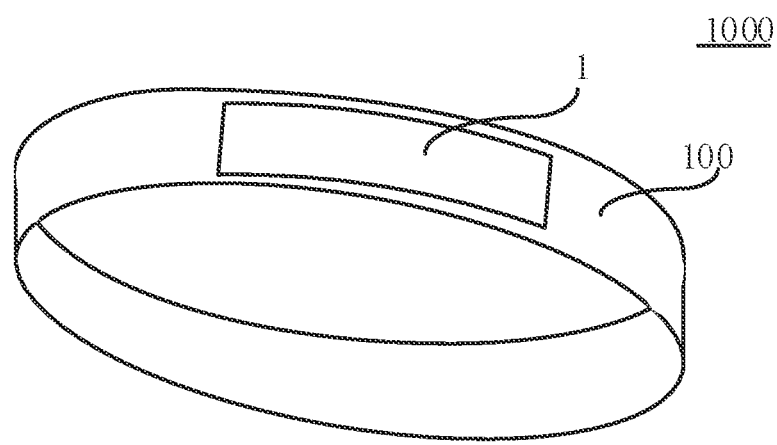
FIG. 17 is a schematic structural diagram of a display device according to some embodiments of the present disclosure.

Embodiments of the present disclosure provide a display device. The display device includes a product with flexible and display function, such as a television, a mobile phone, a tablet computer, a personal digital assistant (PDA), a vehicle-mounted computer, or a wearable display device. For example, as shown in FIG. 17, the display device 1000 is a smart bracelet in wearable display devices. The smart bracelet adopts a soft and elastically deformable casing 100, and a display substrate 1 provided in the casing. The display substrate 1 is a stretchable display substrate.

The embodiments of the present disclosure do not particularly limit a specific form of the display device.

In some embodiments, the display device is an electroluminescent display device, such as an organic light-emitting diode (OLED) display device or a quantum dot light-emitting diode (QLED) display device. In another embodiment, the display device is a photoluminescent display device, such as a quantum dot photoluminescent display device.

For the convenience of description, an example is taken in which the display device is an OLED display device. The OLED display device includes a display substrate.

Referring to FIGS. 1 to 4, some embodiments of the present disclosure provide a display substrate 1. The display substrate 1 has a display region a1 and a non-display region a2 located at at least one side of the display region a1. Optionally, the non-display region a2 is located at one side of the display region a1, or at a plurality of sides of the display region a1. For example, as shown in FIG. 1, the non-display region a2 is arranged around the display region a1. The embodiments of the present disclosure do not specifically limit a manner in which the display region a1 and the non-display region a2 of the display substrate 1 are arranged.

Figure 2:
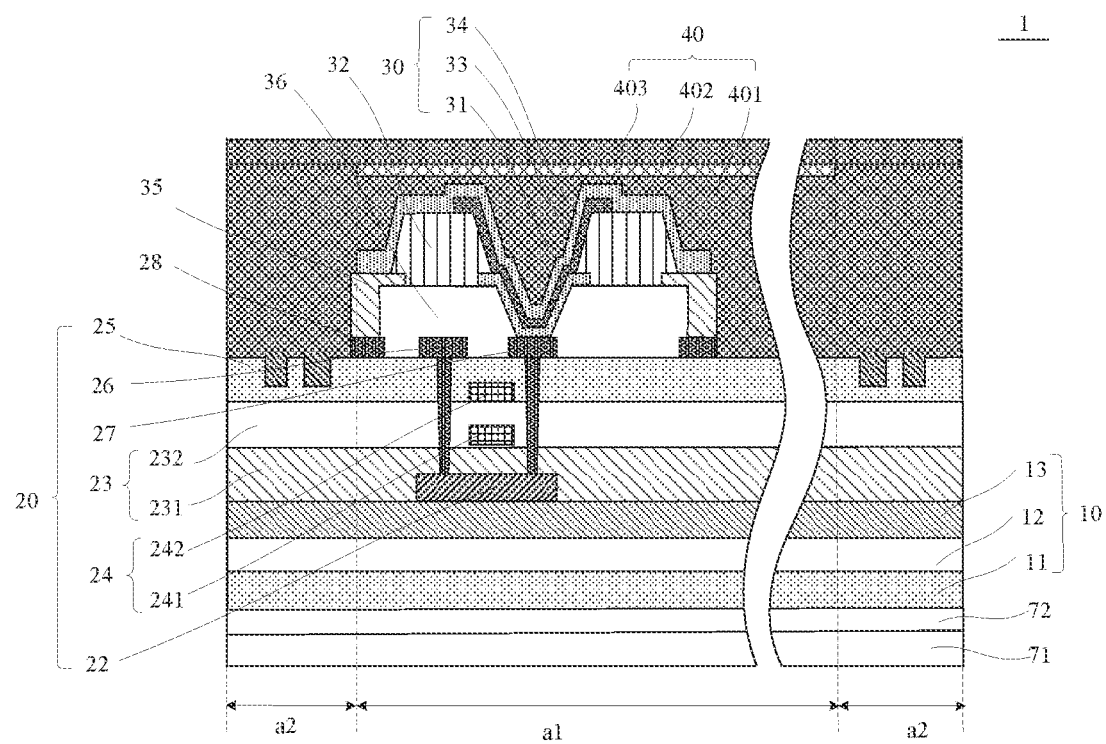
FIG. 2 is a schematic cross-sectional view of the display substrate shown in FIG. 1 taken along an X-axis direction.

The display substrate 1 includes a base 10, a plurality of light-emitting devices 30 disposed on a side of the base 10, and pixel driving circuits correspondingly coupled to the light-emitting devices 30. The plurality of light-emitting devices 30 are located in the display region a1. Only one of the plurality of light-emitting devices 30 is shown in FIG. 2. A pixel driving circuit corresponds to a light-emitting device 30, and is configured to drive the light-emitting device 30 to emit light. The pixel driving circuit includes at least one thin film transistor 20.

In some embodiments, the base 10 is a base substrate 11 on which no thin film is provided. The base substrate 11 may be a rigid substrate or a flexible substrate. In a case where the base substrate 11 is a flexible substrate, the display substrate 1 can be applied to a stretchable and foldable display device.

In some other embodiments, as shown in FIG. 2, the base 10 is composed of the base substrate 11 and some thin films provided on the base substrate 11. The number and materials of the thin films may be set according to actual needs.

For example, the base 10 includes the base substrate 11 and a barrier layer 12 disposed on the base substrate 11. The barrier layer 12 is able to prevent water and oxygen from entering the display substrate 1 from a side where the base substrate 11 is located, thereby effectively extending a service life of the display substrate 1. The barrier layer 12 is an inorganic layer of a single-layer or multi-layer structure. The barrier layer 12 is made of $SiO_x$, $SiON_x$, or $SiN_x$, which is not limited thereto. Optionally, the barrier layer 12 is made of an inorganic semiconductor material, such as an amorphous silicon material, or a polysilicon material. Optionally, the barrier layer 12 is made of an organic semiconductor material or an oxide semiconductor material. Herein, the oxide semiconductor materials include oxides of metal elements in groups 12, 13, and 14 (e.g., Zn, In, Ga).

For example, the base 10 further includes a buffer layer 13 disposed on a side, facing away from the substrate base 11, of the barrier layer 12. The buffer layer 13 is an inorganic layer of a single-layer or multi-layer structure. The buffer layer 13 is made of $SiO_x$, $SiON_x$, or $SiN_x$, which is not limited thereto. Optionally, the buffer layer 13 is made of an inorganic semiconductor material, such as an amorphous silicon material, or a polysilicon material. Optionally, the buffer layer 13 is made of an organic semiconductor material or an oxide semiconductor material. Herein, the oxide semiconductor materials include oxides of metal elements in groups 12, 13, and 14 (e.g., Zn, In, Ga).

The pixel driving circuit is usually composed of electronic devices, such as a plurality of thin film transistors 20 and at least one capacitor, connected in series and in parallel. Only the thin film transistor 20 is shown in FIG. 2 to indicate a specific position of the pixel driving circuit. The embodiments of the present disclosure do not limit a structure of the pixel driving circuit, which may be set according to actual needs.

Figure 3:
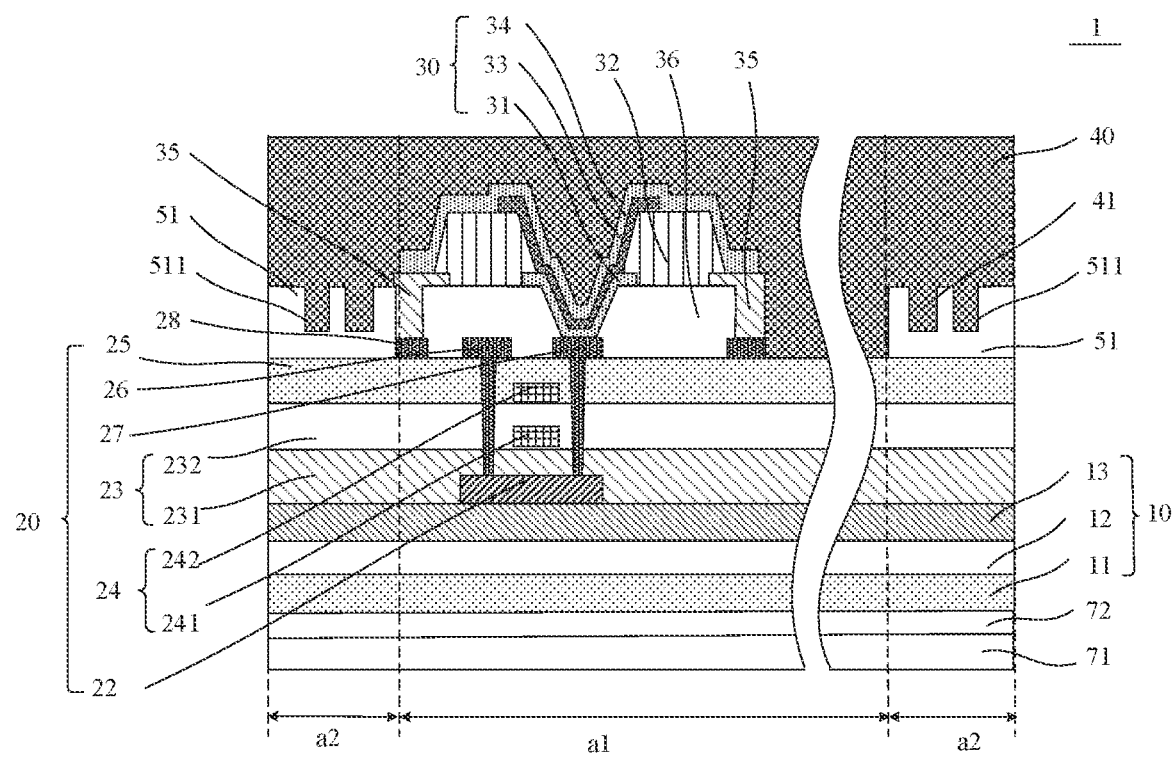
FIG. 3 is another schematic cross-sectional view of the display substrate shown in FIG. 1 taken along the X-axis direction.

Referring to FIGS. 2 and 3, the thin film transistor 20 includes an active layer 22, a portion of a gate insulating layer 23, a gate 24, a portion of an interlayer insulating layer 25, a source 26 and a drain 27. The drain 27 and the source 26 are both connected to the active layer 22. Depending on a relative positional relationship between the gate 24 and the active layer 22 in the thin film transistor 20, the thin film transistor 20 has a top gate structure, a bottom gate structure, or a double gate structure, which are all allowed. The embodiments of the present disclosure are illustrated by taking an example in which the thin film transistor 20 adopts the double gate structure. That is, in the thin film transistor 20, the gate 24 is located at a side, facing away from the base 10, of the active layer 22, and the gate 24 includes a first gate 241 and a second gate 242 that are sequentially arranged in a direction away from the active layer 22. The gate insulating layer 23 includes a first gate insulating layer 231 and a second gate insulating layer 232. The first gate insulating layer 231 is located between the active layer 22 and the first gate 241, and the second gate insulating layer 232 is located between the first gate 241 and the second gate 242. The interlayer insulating layer 25 is located between the second gate 242 and both the source 26 and the drain 27. The source 26 and the drain 27 are connected to the active layer 22 through corresponding vias that penetrate the interlayer insulating layer 25, the second gate insulating layer 232, and the first gate insulating layer 231.

The gate insulating layer 23 and the interlayer insulating layer 25 are both made of an insulating material. The insulating material is $SiO_x$, $SiON_x$, or $SiN_x$, which is not limited thereto. Optionally, the gate insulating layer 23 and the interlayer insulating layer 25 are made of an inorganic semiconductor material, such as an amorphous silicon material, or a polysilicon material. Optionally, the gate insulating layer 23 and the interlayer insulating layer 25 are made of an organic semiconductor material or an oxide semiconductor material. Here, the oxide semiconductor materials include oxides of metal elements in groups 12, 13, and 14 (e.g., Zn, In, Ga).

The gate 24, the source 26, and the drain 27 of the thin film transistor 20 are made of a conductive material. Optionally, the conductive material is a conductive metal such as Ti, Al, Mo, or Ag, or a conductive oxide such as ITO, IZO, ZnO, $In_2O_3$, IGO, or AZO. Or, the conductive material is a highly ductile conductive material such as rubber mixed with conductive particles, for example, a carbon nanotube.

In some embodiments, as shown in FIG. 2, the display substrate 1 further includes a planarization layer 36 disposed on a surface, away from the base 10, of the thin film transistors 20. The planarization layer 36 is used to planarize a surface of the base 10 on which the thin film transistors 20 have been formed, so that other thin films are fabricated on the planarized surface. For example, light-emitting layers for constituting the light-emitting devices 30 are fabricated on the planarized surface, so as to ensure a uniformity of light emitted from the light-emitting devices 30. The planarization layer 36 may be fabricated by forming a film through a spin coating process, and then patterning the film through a photolithography process.

In addition, as shown in FIG. 2, the display substrate 1 further includes a pixel defining layer 32 disposed on a side, away from the base 10, of the planarization layer 36. The pixel defining layer 32 includes a plurality of openings, and the light-emitting layers of the plurality of light-emitting devices 30 are arranged in the plurality of openings of the pixel defining layer 32 in one-to-one correspondence.

The planarization layer 36 or the pixel defining layer 32 is made of an organic material. Optionally, the planarization layer 36 or the pixel defining layer 32 is made of at least one of a polymer based on polymethyl methacrylate and polystyrene, a polymer and a derivative based on a phenol group, a polymer based on acryl, a polymer based on p-xylene, a polymer based on aryl ether, a polymer based on an amide, a polymer based on a fluoride, or a polymer based on vinyl alcohol.

As shown in FIGS. 2 and 3, the light-emitting device 30 includes an anode 31, a light-emitting layer 33, and a cathode 34. The anode 31 of the light-emitting device 30 is connected to the drain 27 or the source 26 of the thin film transistor 20 in a corresponding pixel driving circuit. The anode 31 and the cathode 34 of the light-emitting device 30 are made of a conductive material. Optionally, the conductive material is a conductive metal such as Ti, Al, Mo, or Ag, or a conductive oxide such as ITO, IZO, ZnO, $In_2O_3$, IGO, or AZO. The light-emitting layer 33 of the light-emitting device 30 is made of at least one of a phosphorescent light-emitting material or a fluorescent light-emitting material.

It can be understood that the display substrate 1 further includes a plurality of signal control lines 28. The plurality of signal control lines 28 are configured to transmit control signals to the pixel driving circuits and the light-emitting devices 30, and may be divided into various types of signal lines depending on the type of signals they transmit. The plurality of signal control lines 28 are made of a conductive metal such as Ti, Al, Mo, or Ag, or a conductive oxide such as ITO, IZO, ZnO, $In_2O_3$, IGO, or AZO.

For example, the plurality of signal control lines 28 are correspondingly coupled to the pixel driving circuits. The plurality of signal control lines 28 include one or more scan signal lines, one or more data signal lines, and one or more power supply voltage lines.

Herein, the scan signal line is, for example, a gate scan line, a reset scan line, or a light-emitting scan line. Optionally, one gate scan line is coupled to a row of pixel driving circuits to transmit gate scan signals to the row of pixel driving circuits. One data signal line is coupled to a column of pixel driving circuits to transmit data voltage signals to the column of pixel driving circuits.

For example, multiple signal control lines 28 are correspondingly coupled to the cathodes 34 of the light-emitting devices 30. The multiple signal control lines 28 include cathode signal control lines for transmitting cathode voltage signals to cathodes of corresponding light-emitting devices.

For example, as shown in FIG. 2, the cathode 34 of the light-emitting device 30 and the signal control line 28 are located in different layers. The display substrate 1 further includes a cathode bridging layer 35 disposed between the cathode 34 and the signal control line 28. The cathode 34 of the light-emitting device 30 is connected to the signal control line 28 through the cathode bridging layer 35. The cathode bridging layer 35 is made of a same or similar material as the signal control lines 28, and details are not repeated here.

Referring to FIG. 2 again, the display substrate 1 further includes an encapsulation layer 40. The encapsulation layer 40 is disposed on a side, facing away from the base 10, of the plurality of light-emitting devices 30, and is configured to encapsulate the plurality of light-emitting devices 30.

For example, the encapsulation layer 40 is a thin film encapsulation layer. For example, as shown in FIG. 2, the encapsulation layer 40 includes a first sub-layer 401, a second sub-layer 402, and a third sub-layer 403 that are sequentially stacked in a direction away from the base 10. The first sub-layer 401 and the third sub-layer 403 are inorganic layers of a single-layer or multi-layer structure, and are made of $SiO_x$, $SiON_x$, $SiN_x$, aluminum oxide, aluminum nitride, titanium nitride, or other substances that can form a dense film. The second sub-layer 402 is an organic layer, and is made of polymethacrylate, polycarbonate, acrylic resin, or epoxy resin, which is not limited thereto. The second sub-layer 402 is an organic layer, and may be fabricated by a printing process, or coating and photolithography processes, or other patterning processes. The second sub-layer 402, the first sub-layer 401, and the third sub-layer 403 are stacked. An area of an orthogonal projection of the first sub-layer 401 on the base 10 is equal to an area of an orthogonal projection of the third sub-layer 403 on the base 10. An area of an orthogonal projection of the second sub-layer 402 on the base 10 is equal to or less than the area of the orthogonal projection of the first sub-layer 401 on the base 10. Optionally, as shown in FIG. 2, the second sub-layer 402 is located in the display region a1. The structure of the encapsulation layer 40 described herein is only an example of an optional structure of the encapsulation layer, and cannot be considered as a limitation to the encapsulation layer 40. In some other examples, the encapsulation layer 40 is a single-layer thin film, such as a single-layer inorganic layer made of $SiO_x$, $SiON_x$, $SiN_x$, aluminum oxide, aluminum nitride, titanium nitride, or other substances that can form a dense film.

A surface, proximate to the base 10, of a portion of the encapsulation layer 40 located in the non-display region a2 of the display substrate 1 is unevenly arranged. That is, the surface, proximate to the base 10, of the portion of the encapsulation layer 40 located in the non-display region a2 is provided with grooves or protrusions.

In some examples, the portion of the encapsulation layer 40 located in the non-display region a2 is in direct contact with the base 10. The surface, in direct contact with the base 10, of the portion of the encapsulation layer 40 located in the non-display region a2 is provided with grooves or protrusions, and a surface of the base 10 in contact with the encapsulation layer 40 is arranged to match the grooves or the protrusions of the encapsulation layer.

In some other examples, the portion of the encapsulation layer 40 located in the non-display region a2 is in direct contact with another thin film (e.g., the interlayer insulating layer 25, the planarization layer 36, or the pixel defining layer 32) located on the base 10. For example, as shown in FIG. 2, the portion of the encapsulation layer 40 located in the non-display region a2 is in direct contact with the interlayer insulating layer 25. A surface of the encapsulation layer 40 in contact with the interlayer insulating layer 25 is provided with protrusions, and a surface of the interlayer insulating layer 25 in contact with the encapsulation layer 40 is provided with grooves that match the protrusions of the encapsulation layer.

In the embodiments of the present disclosure, by arranging the surface, proximate to the base 10, of the portion of the encapsulation layer 40 located in the non-display region a2 of the display substrate 1 to be unevenly arranged, it may be possible to increase an contact area between the encapsulation layer 40 and a thin film in direct contact therewith, and extend a water and oxygen erosion path without changing an encapsulation size, thereby effectively improving an encapsulation performance of the encapsulation layer 40.

In some embodiments, as shown in FIG. 3, the display substrate 1 further includes a dielectric layer 51 located in the non-display region a2 of the display substrate 1. The dielectric layer 51 is located on a side, proximate to the base 10, of the encapsulation layer 40. A surface of the dielectric layer 51 proximate to the encapsulation layer 40 matches the grooves or protrusions at an edge of the encapsulation layer 40. The dielectric layer 51 is disposed between the base 10 and the encapsulation layer 40. For example, a side of the dielectric layer 51 proximate to the base 10 is in direct contact with the base 10. Alternatively, the dielectric layer 51 is in direct contact with another thin film (e.g., the gate insulating layer 23 or the interlayer insulating layer 25) located on the base 10.

For example, as shown in FIG. 3, a portion, proximate to the encapsulation layer 40, of the dielectric layer 51 has a plurality of first grooves 511. The portion of the encapsulation layer 40 located in the non-display region a2 has a plurality of first protrusions 41. The plurality of first protrusions 41 are in one-to-one correspondence with the plurality of first grooves 511. It can also be understood as that, an orthogonal projection of a first protrusion 41 of the encapsulation layer 40 on the base 10 is located within an orthogonal projection of a corresponding first groove 511 of the dielectric layer 51 on the base 10. For example, each first protrusion 41 of the encapsulation layer 40 is located in a corresponding first groove 511 of the dielectric layer 51.

Optionally, there is a first distance between any two adjacent first grooves 511, and a distance between any two adjacent first protrusions 41 of the encapsulation layer 40 is equal to or approximately equal to the first distance. In this way, it may be possible to ensure that the plurality of first protrusions 41 of the encapsulation layer 40 correspond to the plurality of first grooves 511 of the dielectric layer 51, and thereby form a tight encapsulation structure. The plurality of first grooves 511 are arranged at intervals, so that the structure stability of the dielectric layer 51 may be ensured. In addition, the plurality of first protrusions 41 of the encapsulation layer 40 are disposed in the corresponding plurality of first grooves 511 of the dielectric layer 51, so as to form an even more stable encapsulation structure. In this way, it may be possible to avoid relative sliding or a tendency of relative sliding between the encapsulation layer 40 and the dielectric layer 51 under an action of an external force, and thereby further improve the encapsulation performance of the encapsulation layer 40.

Optionally, a depth of the first groove 511 is 70% to 100% of a thickness of the dielectric layer 51. For example, the depth of the first groove 511 is 70%, 80%, 90%, or 100% of the thickness of the dielectric layer 51. By setting the depth of the first groove 511 to a reasonable value, it may be possible to ensure a reasonable contact area of protrusions and grooves between the encapsulation layer 40 and the dielectric layer 51, and thereby ensure a good encapsulation performance of the encapsulation layer 40.

The dielectric layer 51 is a thin film independently fabricated in the non-display region a2, or is a portion of an existing thin film in the display substrate 1 located in the non-display region a2, for example, a portion of the planarization layer 36 located in the non-display region a2 and/or a portion of the pixel defining layer 32 located in the non-display region a2.

Figure 4:
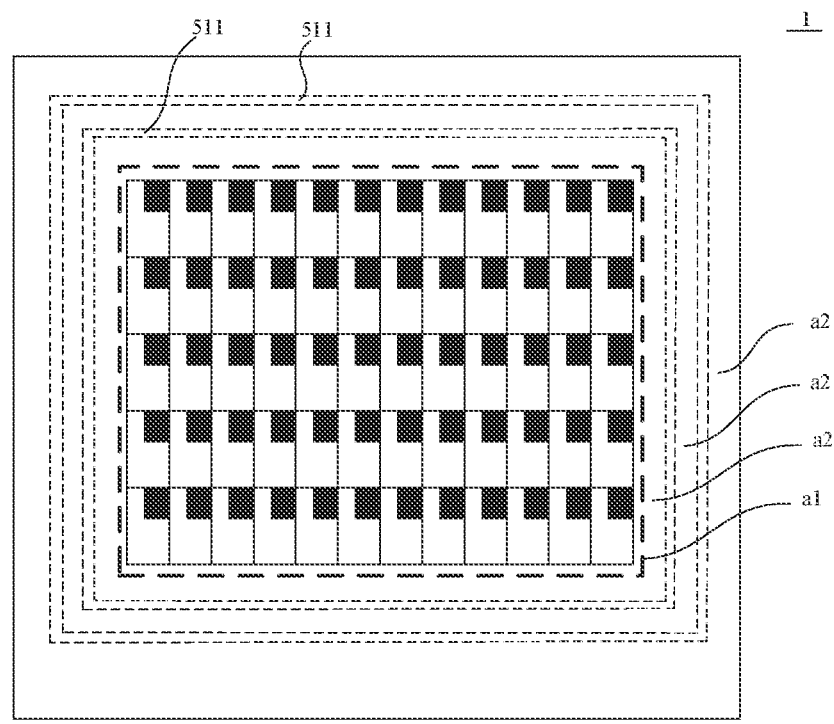
FIG. 4 is a schematic diagram showing a distribution of the first grooves shown in FIG. 3.

In some embodiments, as shown in FIG. 4, the non-display region a2 of the display substrate 1 is arranged around the display region a1. The first groove 511 of the dielectric layer 51 is a loop-shaped groove, and the first protrusion 41 of the encapsulation layer 40 is a loop-shaped protrusion. The loop-shaped protrusion of the encapsulation layer 40 is located in a corresponding loop-shaped groove of the dielectric layer 51, thereby forming a sealed encapsulation structure with a high tightness in the shape of a loop, and further improving the encapsulation effect of the display substrate 1.

The shape and the number of the first grooves 511 may be set according to actual needs. The first groove 511 is, for example, in the shape of a circular loop or a rectangular loop. The number of the first grooves 511 is, for example, one or more. For example, as shown in FIG. 4, there are a plurality of first grooves 511, which are in the shape of a rectangular loop. The plurality of first grooves 511 are distributed at equal intervals with the display region a1 as a center.

The dielectric layer 51 is made of an insulating material. Optionally, the dielectric layer 51 is made of $SiO_x$, $SiON_x$, or $SiN_x$, which is not limited thereto. Optionally, the dielectric layer 51 is made of an inorganic semiconductor material, such as an amorphous silicon material, or a polysilicon material. Optionally, the dielectric layer 51 is made of an organic semiconductor material or an oxide semiconductor material. Herein, the oxide semiconductor materials include oxides of metal elements in groups 12, 13 and 14 (e.g., Zn, In, or Ga).

In some embodiments, as shown in FIGS. 2 and 3, the display substrate 1 further includes a base film 71 located on a surface, away from the encapsulation layer 40, of the base 10. The base film 71 is made of an elastic material, which is, for example, dimethyl siloxane, polyimide, PET, or other materials having high elasticity. The base film 71 can protect the display substrate 1, particularly, a display substrate 1 in which the base substrate 11 is a flexible substrate. Optionally, the base film 71 is fixed on the surface, away from the encapsulation layer 40, of the base 10 through an adhesive layer 72. The adhesive layer 72 is an optically clear adhesive (OCA), which is made of an acrylic adhesive or a silicon adhesive.

Referring to FIGS. 5 to 16, some embodiments of the present disclosure provide another display substrate 1. The display substrate 1 is a stretchable display substrate or a foldable display substrate. A base 10 in the display substrate is made of a flexible material, for example, one of polyimide, PET, or metal. In this way, by setting the material of the base 10 to be a flexible material, it is advantageous for realizing the stretching or folding of the display substrate 1.

Figure 5:
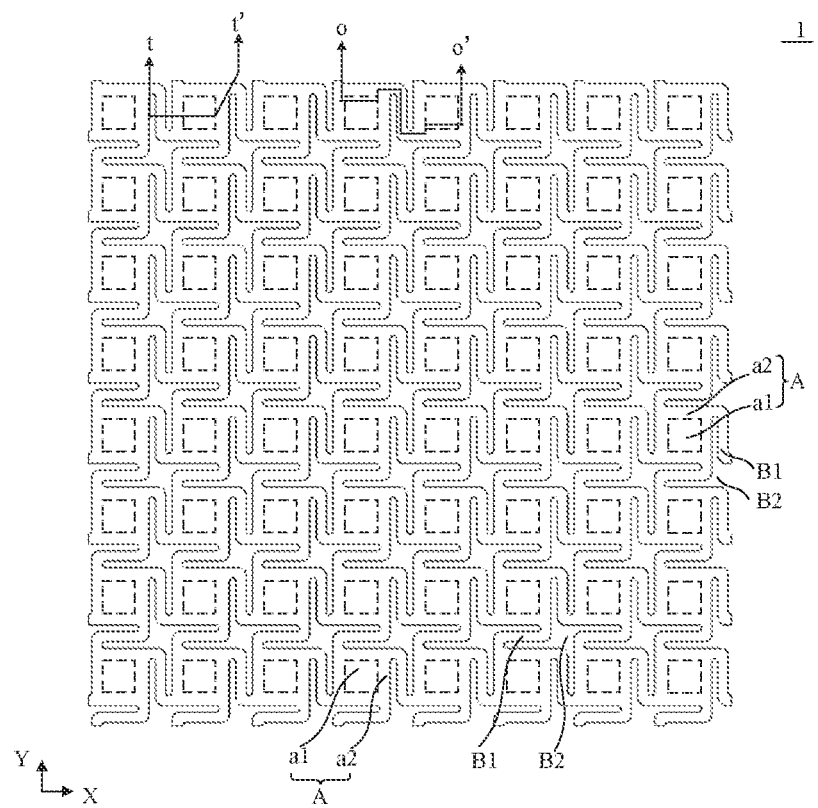
FIG. 5 is a schematic structural diagram of yet another display substrate according to some embodiments of the present disclosure.

Referring to FIG. 5, the display substrate 1 has a plurality of pixel regions A arranged in an array and a non-pixel region B located at at least one side of each pixel region A. Each pixel region A includes a display region a1 and a non-display region a2. The non-pixel region B includes a connection region B1 and an opening region B2.

Herein, as for the arrangement of the display region a1 and the non-display region a2, reference may be made to the related description in some of the foregoing embodiments. For example, in the display region a1 of each pixel region A, a plurality of light-emitting devices 30 are arranged in an array, and corresponding pixel driving circuits are arranged in an array. A plurality of signal control lines 28 are further provided in each pixel region A. There are one or more connection regions B1 between any two adjacent pixel regions A. The display substrate 1 further includes a plurality of signal connection lines 91 located in a connection region B1. At least one end of each signal connection line 91 is connected to a corresponding signal control line 28 in an adjacent pixel region A. The signal connection line 91 is made of a same or similar material as the signal control line 28.

The plurality of pixel regions A are arranged in an array, so that the connection regions B1 may be divided into two types depending on a relative positional relationship between the connection region B1 and a corresponding pixel region A. In a first type of connection region B1, the connection region B1 is located between two adjacent pixel regions A. That is, at least one connection region B1 is provided between any two adjacent pixel regions A. In this way, both ends of each signal connection line 91 located in the connection region B1 are respectively connected to corresponding signal control lines 28 in the adjacent pixel regions A. In a second type of connection region B1, the connection regions B1 are located at an outer edge of the array of pixel regions A. That is, the connection regions B1 are located at a peripheral region of the display substrate 1. In this way, one end of each signal connection line 91 located in a connection region B1 is connected to a corresponding signal control line 28 in an adjacent pixel region A, and another end thereof is led out to be connected to an external circuit located in the peripheral region of the display substrate 1. Herein, the external circuit in the peripheral region of the display substrate 1 includes, but is not limited to, a driver IC.

For example, as shown in FIG. 5, a connection region B1 is provided between any two adjacent pixel regions A, and a connection region B1 is connected to edges of two corresponding pixel regions A located at different positions thereof (e.g., at a lower right corner of a pixel region A and at an upper left corner of another pixel region A), so that the connection region B1 is arranged at an angle with the pixel regions A to which it is connected. An opening region B2 is located in a gap between a corresponding connection region B1 and a corresponding pixel region A. Between the plurality of adjacent pixel regions A, some of the opening regions B2 may be communicated to form a single region, for example, a cross-shaped region as shown in FIG. 5.

Figure 6:
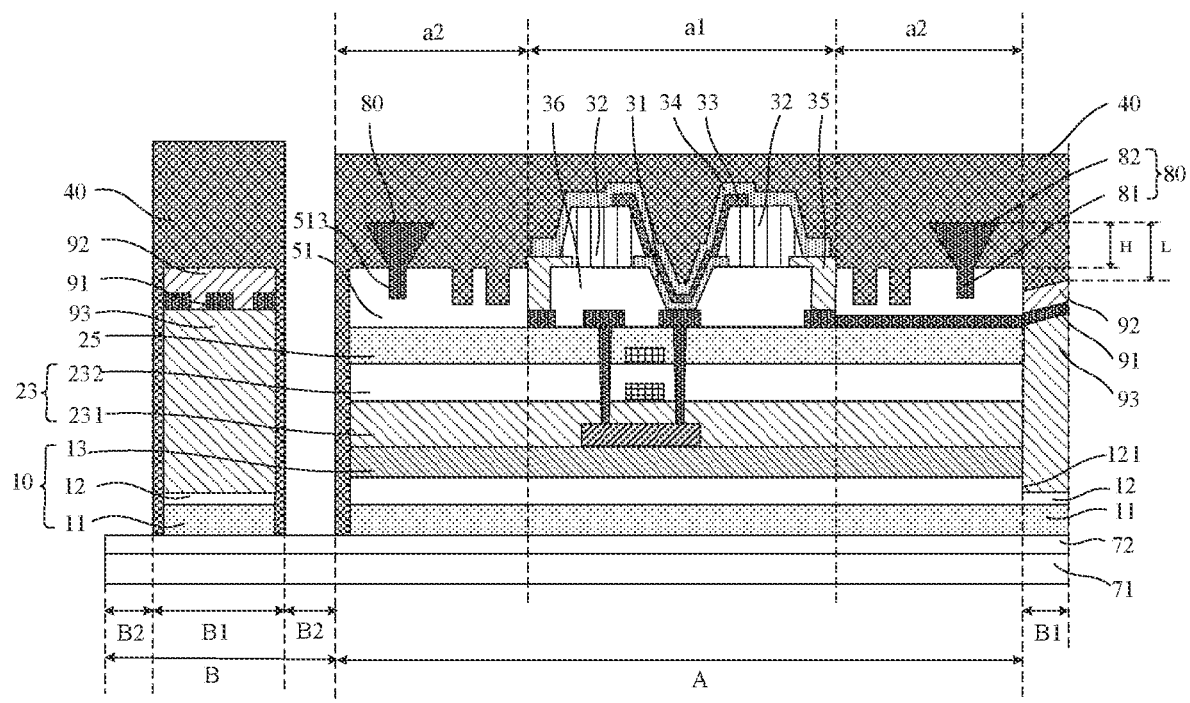
FIG. 6 is a schematic sectional view of yet another display substrate shown in FIG. 5 taken along the t-t' direction.

The opening region B2 is hollowed, which means that the base 10 and some thin films on the base 10 are hollowed in the opening region B2. For example, as shown in FIG. 6, portions, located in opening regions B2, of the base 10, a gate insulating layer 23, and an interlayer insulating layer 25 are etched. Since the opening region B2 is hollowed, a deformable range of a corresponding pixel region A may be increased. As a result, a stress applied to the display substrate 1 in a process of stretching the display substrate 1 may be effectively released, and an amount of a strain may be reduced. Therefore, it may be possible to avoid structural damages to the display substrate 1 caused by the stress during a stretching process.

In the display substrate provided in the embodiments of the disclosure, a portion of the encapsulation layer 40 located in a non-display region a2 is unevenly arranged, which not only ensures a good encapsulation performance of the encapsulation layer 40, but also helps to reduce a proportion of a space occupied by the non-display region a2 to an entire space of a corresponding pixel region A. Therefore, it may be possible to avoid a large pixel distance between two adjacent display regions a1, so as to effectively improve the display effect of the stretchable display substrate.

Figure 7:
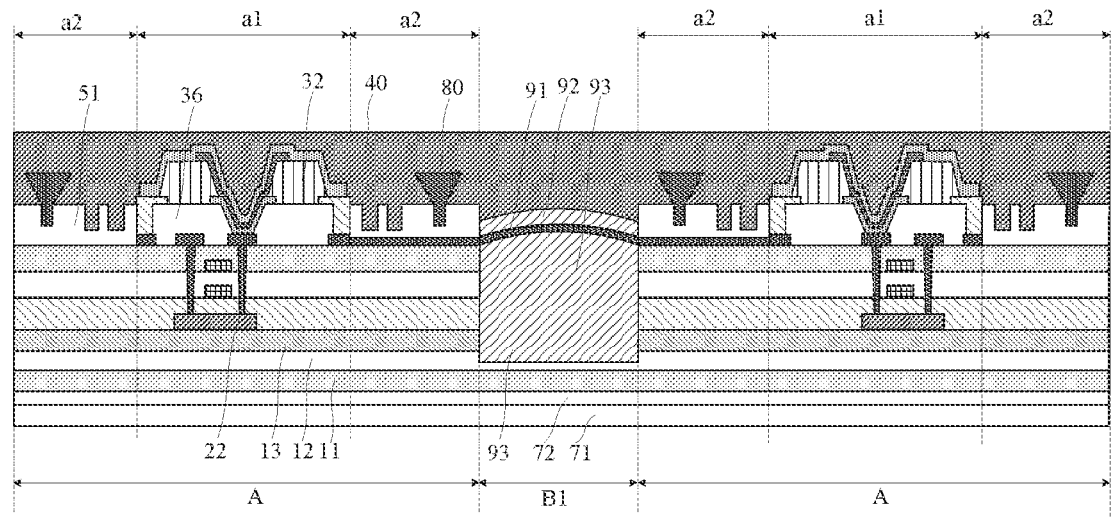
FIG. 7 is a schematic sectional view of yet another display substrate shown in FIG. 5 taken along the o-o' direction.

In some embodiments, as shown in FIGS. 6 and 7, the display substrate 1 further includes a first signal line protection layer 92 and a second signal line protection layer 93 that are located in the connection regions B1. The first signal line protection layer 92 and the second signal line protection layer 93 are both made of an organic material, and are arranged at both sides of the plurality of signal connection lines 91 in a direction perpendicular to a surface of the base 10 facing the encapsulation layer 40, respectively. For example, the first signal line protection layer 92 is located on a top surface of the signal connection lines 91, and the second signal line protection layer 93 is located on a bottom surface of the signal connection lines 91.

Furthermore, for example, other thin films such as a barrier layer 12 and a buffer layer 13 are provided on a side, proximate to the base substrate 11, of portions of the second signal line protection layer 93 located in the connection regions B1. The barrier layer 12 and the buffer layer 13 are generally made of an inorganic material. On this basis, since the display substrate 1 is further provided with the gate insulating layer 23, the interlayer insulating layer 25, etc. that are located on the buffer layer 13 and made of an inorganic material, by removing portions of the buffer layer 13, the gate insulating layer 23, the interlayer insulating layer 25, etc. that are located in the connection region B1, a total thickness of inorganic thin films in the connection region B1 may be effectively reduced, making it possible to fabricate the second signal line protection layer 93 in a region where the thickness of the inorganic thin films is reduced. The second signal line protection layer 93 is made of an organic material, and has good ductility. A thickness of the second signal line protection layer 93 in the direction perpendicular to the surface of the base facing the encapsulation layer 40 is equal or approximately equal to a thickness of the removed portions of the inorganic thin films, which is conducive to forming planarized signal connection lines 91 on the second signal line protection layer 93. The first signal line protection layer 92 is also made of an organic material. In this way, due to the good ductility of the organic material, it may be possible to use the first signal line protection layer 92 and the second signal line protection layer 93 to protect the signal connection lines 91, and prevent the signal connection lines 91 from being broken in case of a brittle fracture of inorganic films in the connection region B1, thereby better protecting the signal connection lines 91.

The first signal line protection layer 92 and the second signal line protection layer 93 are both made of at least one of a polymer based on polymethyl methacrylate and polystyrene, a polymer and a derivative based on a phenol group, a polymer based on acryl, a polymer based on p-xylene, a polymer based on acryl ether, a polymer based on an amide, a polymer based on a fluoride, or a polymer based on vinyl alcohol. Both the first signal line protection layer 92 and the second signal line protection layer 93 may be fabricated by forming a film through a spin coating process, and then patterning the film through a photolithography process.

In some embodiments, a thickness of a portion of the barrier layer 12 located in the connection region B1 is less than a thickness of a portion of the barrier layer 12 located in the pixel region A. That is, a groove or a through hole is formed in the portion of the barrier layer 12 located in the connection region B1.

Figure 9:
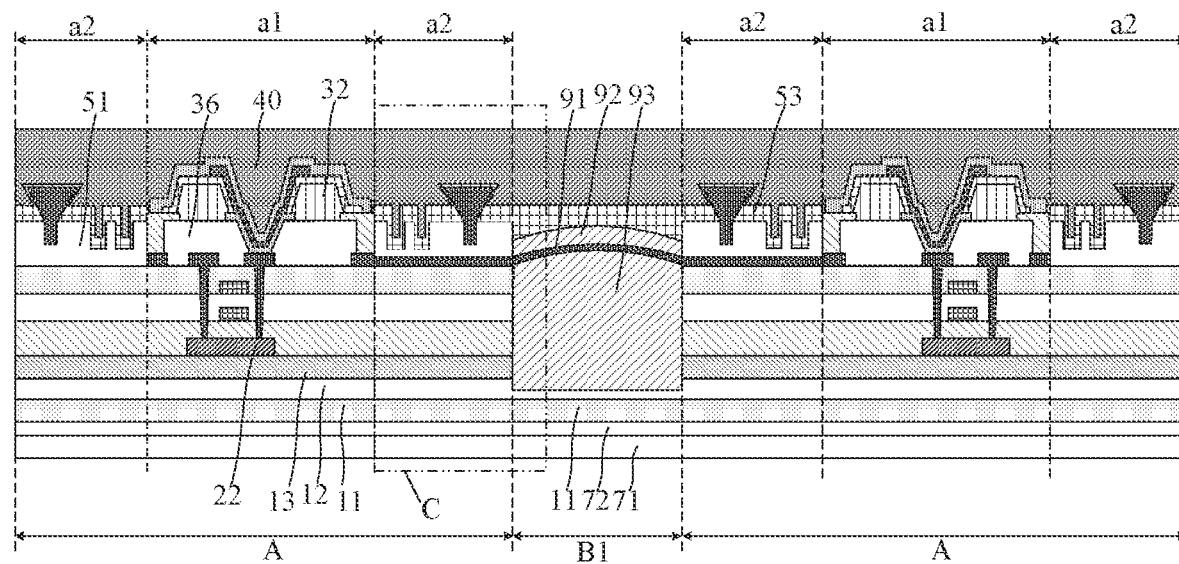
FIG. 9 is a schematic sectional view of yet another display substrate shown in FIG. 5 taken along the o-o' direction.
Figure 10:
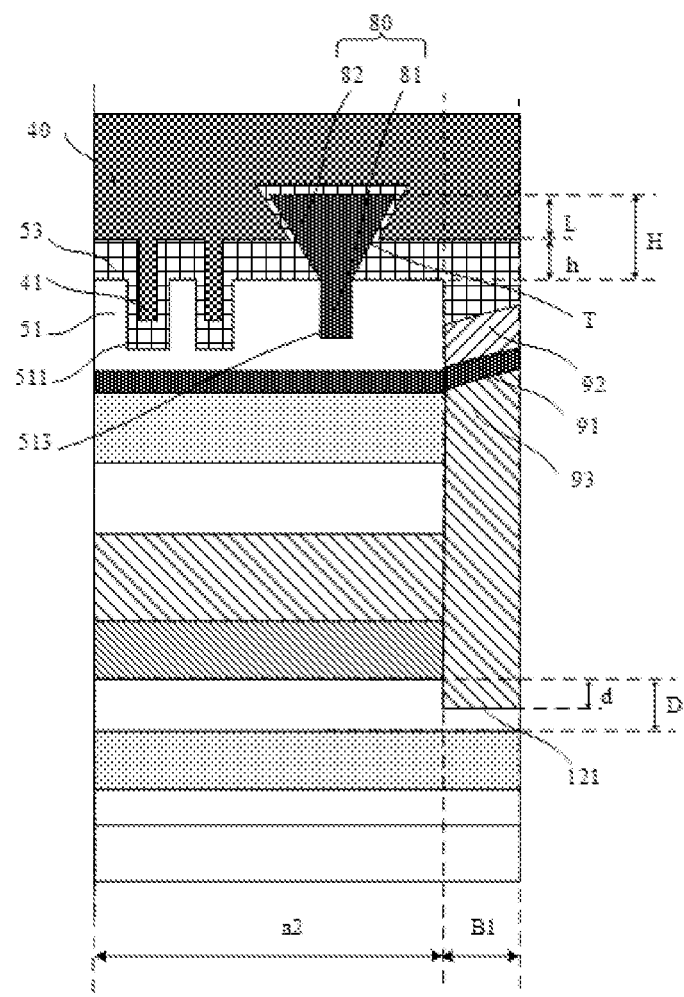
FIG. 10 is a schematic enlarged view of the region C of FIG. 9.
Figure 11:
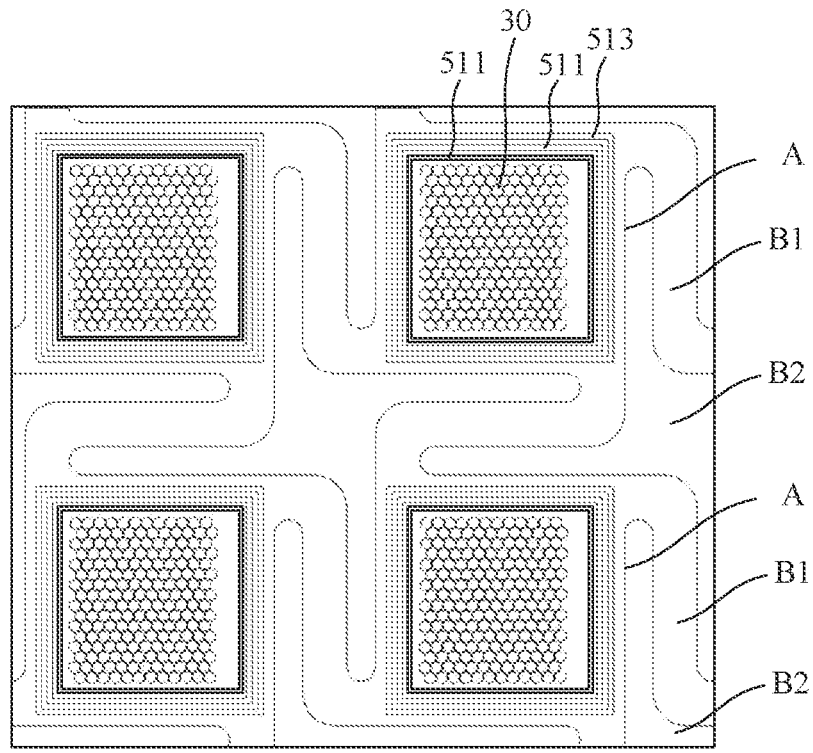
FIG. 11 is a schematic diagram showing a distribution of fixing grooves according to some embodiments of the present disclosure.

For example, as shown in FIGS. 9 and 10, the portion, located in the connection region B1, of the barrier layer 12 has a third groove 121, and the second signal line protection layer 93 is located in the third groove 121. A depth d of the third groove 121 is less than or equal to a thickness D of the portion of the barrier layer 12 located in the pixel region, which may be possible to achieve a purpose of reducing the thickness of or removing the portion of the barrier layer 12 made of an inorganic material located in the connection region B1, thereby reducing deformation cracks caused by excessively thick inorganic layers in the connection region B1 when the display substrate 1 is stretched.

In some embodiments, as shown in FIGS. 6 to 10, the display substrate 1 further includes one or more barrier members 80 located in the non-display region a2. The barrier members 80 are located on the side, proximate to the base 10, of the encapsulation layer 40, and are configured to block a deformation crack from propagating from the connection region B1 to the display region a1 in a case where the deformation crack appears in a portion, located in the connection region B1, of the encapsulation layer 40. The non-display region a2 is located between a display region a1 in a same pixel region A and a corresponding connection region B1.

Barrier members 80 are disposed on a side, proximate to the base 10, of portions of the encapsulation layer 40 located in the non-display regions a2. There is a certain distance between an end face of an end, facing away from the base 10, of the barrier 80 and an end face, proximate to the base 10, of the portion of the encapsulation layer 40 located in the connection region B1 in the direction perpendicular to the surface of the base facing the encapsulation layer 40, so that a step (a height of the step is, for example, L as shown in FIG. 6) is formed between the portion of the encapsulation layer 40 located in the non-display region a2 and the portion of the encapsulation layer 40 located on the barrier member 80. In this way, in the case where a deformation crack appears in the portion of the encapsulating layer 40 located in the connection region B1, the step may be able to effectively block the deformation crack in the encapsulating layer 40 from propagating from the connection region B1 to the display region a1 through the non-display region a2, thereby avoiding an adverse effect on the display effect of the display substrate 1.

It will be noted that, in some embodiments where the display substrate 1 includes the dielectric layer 51, as shown in FIG. 6, the barrier members 80 may be provided between the encapsulation layer 40 and the dielectric layer 51. In some other embodiments where the display substrate 1 does not include the dielectric layer 51, the barrier members 80 may be provided between the encapsulation layer 40 and the base 10, or between the encapsulation layer 40 and another thin film (e.g., the interlayer insulating layer 25) on the base 10, which are both allowed. An optional arrangement of the barrier members 80 is illustrated below by taking an example in which the display substrate includes the dielectric layer 51. In a case where the display substrate 1 does not include the dielectric layer 51, reference may also be made to the following description regarding the specific arrangement of the barrier members 80.

Figure 8:
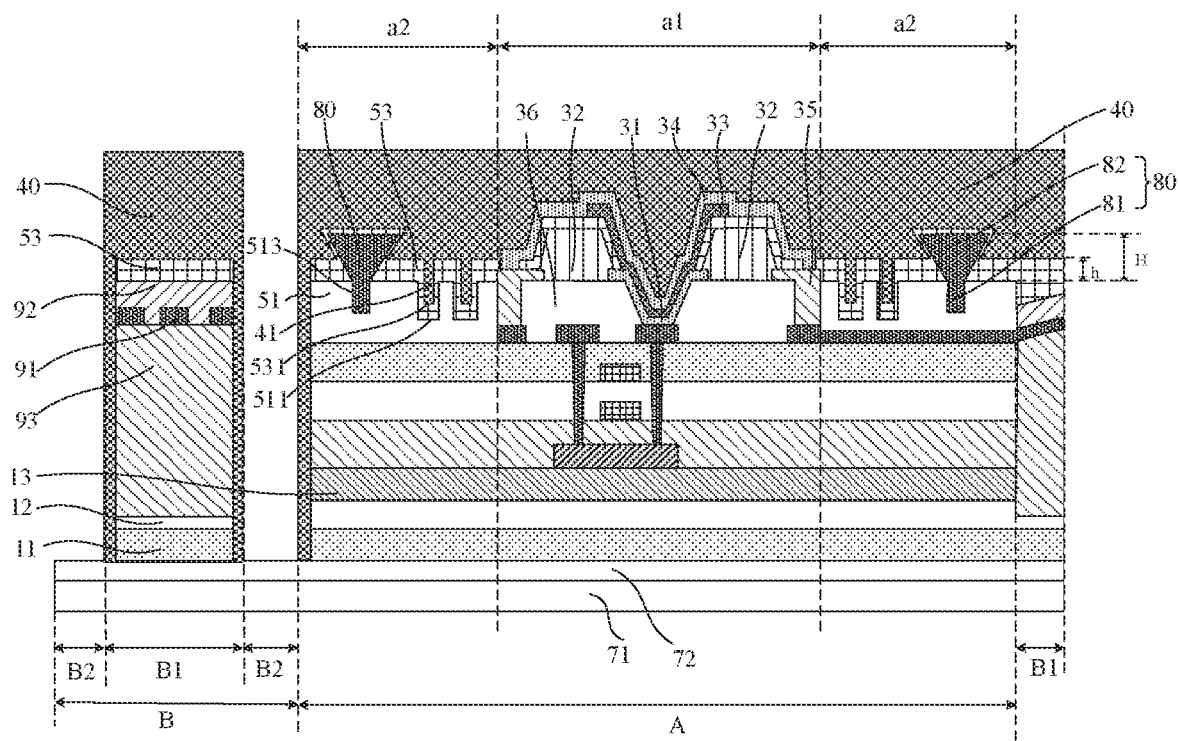
FIG. 8 is a schematic sectional view of yet another display substrate shown in FIG. 5 taken along the t-t' direction.

In some embodiments, as shown in FIG. 8, a portion, proximate to the encapsulation layer 40, of the dielectric layer 51 has a fixing groove 513 configured to match with the barrier member 80. An end of the barrier 80 is disposed in a corresponding fixing groove 513 in the dielectric layer 51, and another end extends in a direction away from the dielectric layer 51. The encapsulation layer 40 covers the barrier members 80.

Figure 12:
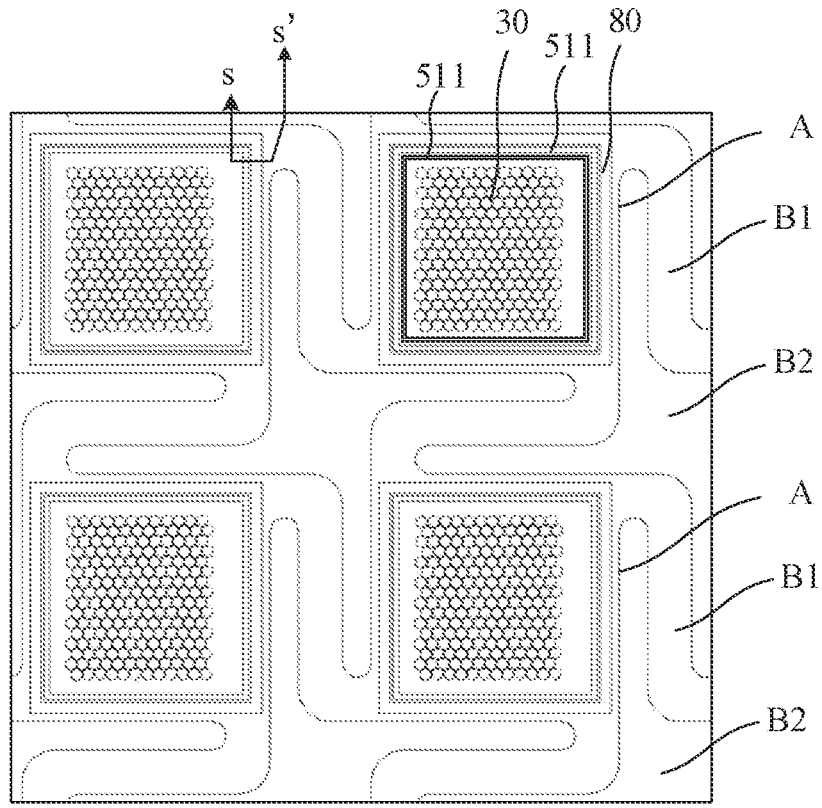
FIG. 12 is a schematic diagram showing a distribution of barrier members according to some embodiments of the present disclosure.
Figure 13:
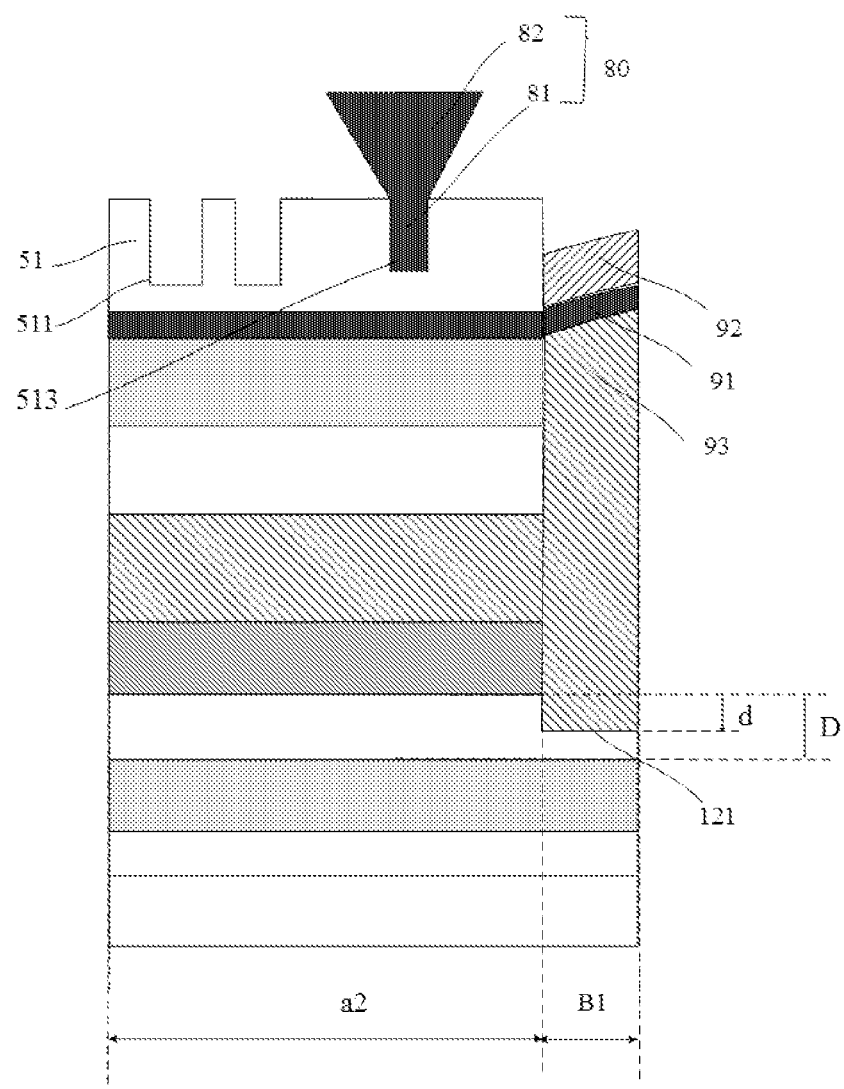
FIG. 13 is a schematic sectional view of the barrier member shown in FIG. 12 taken along the s-s' direction.

In some embodiments, referring to FIGS. 12 and 13, there is one barrier member 80 in the non-display region a2, that is, a loop-shaped barrier member is adopted. An inner boundary of an orthogonal projection of the loop-shaped barrier member on the base 10 is located outside of the display region a1. That is, the loop-shaped barrier member is located in the non-display region a2, and may form an enclosed loop-shaped barrier outside the same display region a1. The loop-shaped barrier may be able to effectively block the deformation crack from entering the display region a1 from the connection area B1 from a peripheral side of the display region a1, and has a better effect of blocking deformation cracks.

Here, a shape of the loop-shaped barrier member may be set according to actual conditions. For example, the shape of the loop-shaped barrier member is a circular loop, a rectangular loop, or any other suitable shapes. Correspondingly, the fixing groove 513 is a loop-shaped groove, and the shape of the loop-shaped groove matches with the shape of the loop-shaped barrier member.

Optionally, as shown in FIG. 12, the first grooves 511 in the dielectric layer 51 are loop-shaped grooves. The fixing groove 513 is provided at a side of the first grooves 511 proximate to the connection region B1. That is, the fixing groove 513 is located at a peripheral side of the first grooves 511 which are annular grooves. Only two first grooves 511 are shown in the non-display region a2 in FIG. 11, but the number of the first grooves 511 is not limited thereto. Of course, the specific arrangement of the first groove 511 and the fixing groove 513 is not limited thereto, which may be set according to actual needs.

Herein, the fixing groove 513 and the first grooves 511 may have similar structures, so as to simplify the patterning design and implementation process of the dielectric layer 51.

In addition, for example, as shown in FIGS. 12 and 13, an area of a cross section of the loop-shaped barrier member in a plane parallel to the surface of the base facing the encapsulation layer 40 increases along the direction away from the base. For example, a longitudinal section of the loop-shaped is in the shape of an inverted trapezoid, and the longitudinal section is perpendicular to the base, and to an extending direction of the loop of the loop-shaped barrier member. Therefore, the loop-shaped barrier member has a good blocking shape, and may be able to block the propagation of deformation cracks that appear in the encapsulation layer more effectively.

Figure 14:
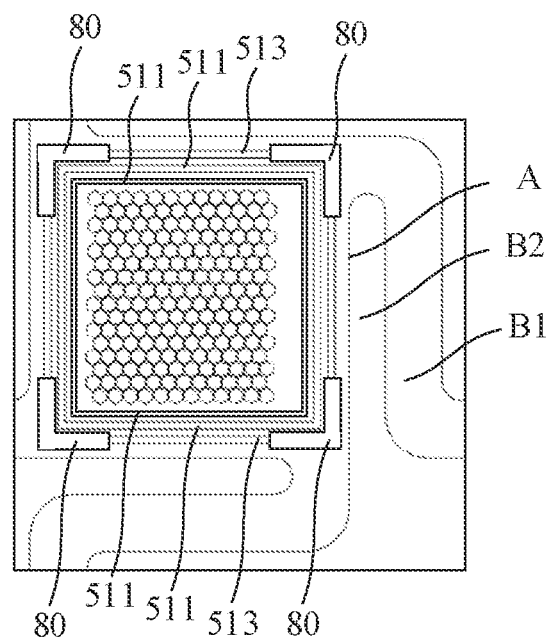
FIG. 14 is a schematic structural diagram of another barrier member according to some embodiments of the present disclosure.

In some other embodiments, referring to FIG. 14, there are a plurality of barrier members 80 (for example, four barrier members 80) in the non-display region a2. The barrier members 80 are right angle-shaped barrier members, and are respectively located outside four top corners of a corresponding display region a1. In this way, it may be possible to reduce a space occupied by the barrier members 80 in the non-display region a2 while ensuring that the barrier members 80 have a good crack barrier effect, which is conducive to reducing a proportion of a space occupied by the non-display region a2 to an entire space of a corresponding pixel region A.

In yet some other embodiments, as shown in FIGS. 6 to 10, the barrier member 80 includes a first sub-portion 81 and a second sub-portion 82 that are connected along the direction perpendicular to the surface of the base 10 facing the encapsulation layer 40. The first sub-portion 81 is located in the fixing groove 513 of the dielectric layer 51, and the second sub-portion 82 extends in a direction away from the first sub-portion 81. As shown in FIG. 8, a height H of the second sub-portion 82 in the direction perpendicular to the surface of the base 10 facing the encapsulation layer 40 is not less than a distance h of a surface, proximate to the base 10, of the portion of the encapsulation layer 40 located in the connection region B1 from a surface of the second sub-portion 82 proximate to the base 10 in the same direction. In this way, a step is formed between the portion of the encapsulation layer 40 located on the barrier member 80 in the non-display region a2 and the portion of the encapsulation layer 40 located in the connection region B1. A height of the step in the direction perpendicular to the base 10 is, for example, L as shown in FIG. 10.

Referring to FIG. 10, the first sub-portion 81 is disposed in the fixing groove 513, and the shape of the first sub-portion 81 may be matched with the shape of the fixing groove 513. The first sub-portion 81 serves as a base of the second sub-portion 82, and the two are in surface contact or integrally formed. The shape of the second sub-portion 82 may be set according to actual needs. For example, an area of a cross section of the second sub-portion 82 in the plane parallel to the surface of the base facing the encapsulation layer 40 gradually increases in the direction away from the base 10, so that a side surface of the second sub-portion 82, whose extension surface intersects the base 10, is an inclined surface T. The inclined surface T extends from the non-display region a2 towards the connection region B1 in the direction away from the base 10. In this way, the second sub-portion 82 has a more effective barrier shape.

During a process of manufacturing the encapsulation layer 40, a portion of the encapsulation layer 40 in contact with the second sub-portion 82 may be deposited along the inclined surface thereof, therefore an effective step shape will be formed between the portion of the encapsulation layer 40 located on the barrier member 80 in the non-display region a2 and the portion of the encapsulation layer 40 located in the connection region B1.

Further, optionally, as shown in FIG. 10, a shape of a longitudinal section of the second sub-section 82 is an inverted trapezoid in a first direction, the first direction being a direction pointing from the non-display region a2 to the connection region B1. As such, by arranging the side surface of the second sub-portion 82, whose extension surface intersects the base 10, to be an inclined surface T, the encapsulation layer 40 may be able to be deposited along the inclined surface T during the manufacturing process and form a more effective barrier shape.

Optionally, the height of the second sub-portion 82 in the direction perpendicular to the surface of the base 10 facing the encapsulation layer 40 is 2 μm to 4 μm. For example, the height of the second sub-portion 82 in the direction perpendicular to the surface of the base 10 facing the encapsulation layer 40 is 2 μm, 3 μm, or 4 μm. The greater the height of the second sub-portion 82 in the direction perpendicular to the surface of the base 10 facing the encapsulation layer 40, the better barrier effect the barrier member 80 has in blocking deformation cracks.

The barrier member 80 is made of an organic material or a negative photoresist. For example, the barrier member 80 is made of at least one of a polymer based on polymethyl methacrylate and polystyrene, a polymer and a derivative based on a phenol group, a polymer based on acryl, a polymer based on p-xylene, a polymer based on aryl ether, a polymer based on an amide, a polymer based on a fluoride, or a polymer based on vinyl alcohol.

In some embodiments, the display substrate 1 further includes an etching protection layer 53 located between the dielectric layer 51 and the encapsulation layer 40. The etching protection layer 53 covers at least the surface, proximate to the encapsulation layer 40, of the dielectric layer 51. The etching protection layer 53 is configured to protect thin film(s) located outside of the opening regions B2 from being etched away during a process of hollowing out the opening regions B2.

For example, the etching protection layer 53 is made of an inorganic insulating material, such as silicon nitride, silicon oxynitride, or silicon oxide.

It will be noted that the etching protection layer 53 is formed after the pixel defining layer 32 is formed and before the opening regions B2 are etched. Thus, the etching protection layer 53 may cover the dielectric layer 51, the exposed anodes 31 and the cathode bridging layers 35, and the pixel defining layer 32, so as to protect them during the process of etching the opening regions B2. For example, portions of the etching protection layer 53 located in the opening regions B2 are removed to form etching reference holes. Thus, portions of some thin films (including the base 10) located below the etching protection layer 53 may be etched away through the etching reference holes, thereby hollowing out the opening regions B2 in the display substrate 1. In this way, other thin films covered by the etching protection layer 53 are not easily affected by the process of hollowing out the opening regions B2.

Based on this, after the opening regions B2 are hollowed out in the display substrate 1, portions of the etching protection layer 53 located on the cathode bridging layer 35, the anodes 31, and other thin films that need to be exposed are removed, so that subsequent manufacturing steps of the display substrate 1 may be performed. For example, the light-emitting layers 33 and the cathodes 34 of the light-emitting devices 30 are sequentially fabricated on the anodes 31 in a way that the cathodes 34 are in contact with corresponding cathode bridging layers 35, and the encapsulation layer 40 is formed on a surface of the cathodes 34 away from the base 10.

The etching protection layer 53 is located between the dielectric layer 51 and the encapsulation layer 40, for example, on the surface of the dielectric layer 51 proximate to the encapsulation layer 40. A surface of the etching protection layer 53 in contact with the dielectric layer 51 has a same shape as a surface of the dielectric layer 51. For example, as shown in FIG. 8, the dielectric layer 51 has first grooves 511. A portion, proximate to the encapsulation layer, of the etching protection layer 53 has second grooves 531. A portion of the encapsulation layer 40 proximate to the etching protection layer 53 has the plurality of first protrusions 41. The plurality of second grooves 531 are in one-to-one correspondence with the plurality of first protrusions 41 of the encapsulation layer 40, and each first protrusion 41 is located in a corresponding second groove 531.

Herein, the etching protection layer 53 is usually formed by a film deposition process, such as a uniform-thickness deposition process. Since the portion of the dielectric layer 51 proximate to the encapsulation layer 40 has the first grooves 511, in the process of forming the etching protection layer 53, the etching protection layer 53 is formed into a shape that matches the surface of the dielectric layer 51, so that the second grooves 531 may be formed in the surface of the etching protection layer 53 away from the dielectric layer 51. Then, when forming the encapsulation layer 40, part of materials of the encapsulation layer 40 is located in the second grooves 531, so as to form the first protrusions 41 that correspond to the second grooves 531.

Figure 15:
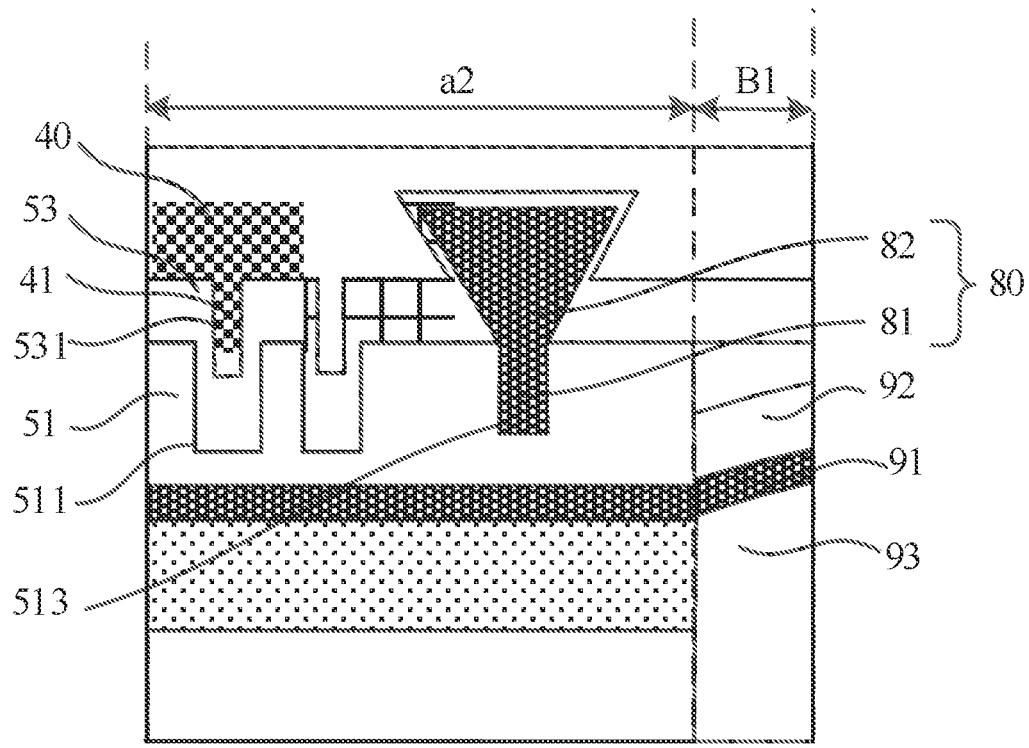
FIG. 15 is a schematic structural diagram of an encapsulation layer according to some embodiments of the present disclosure.
Figure 16:
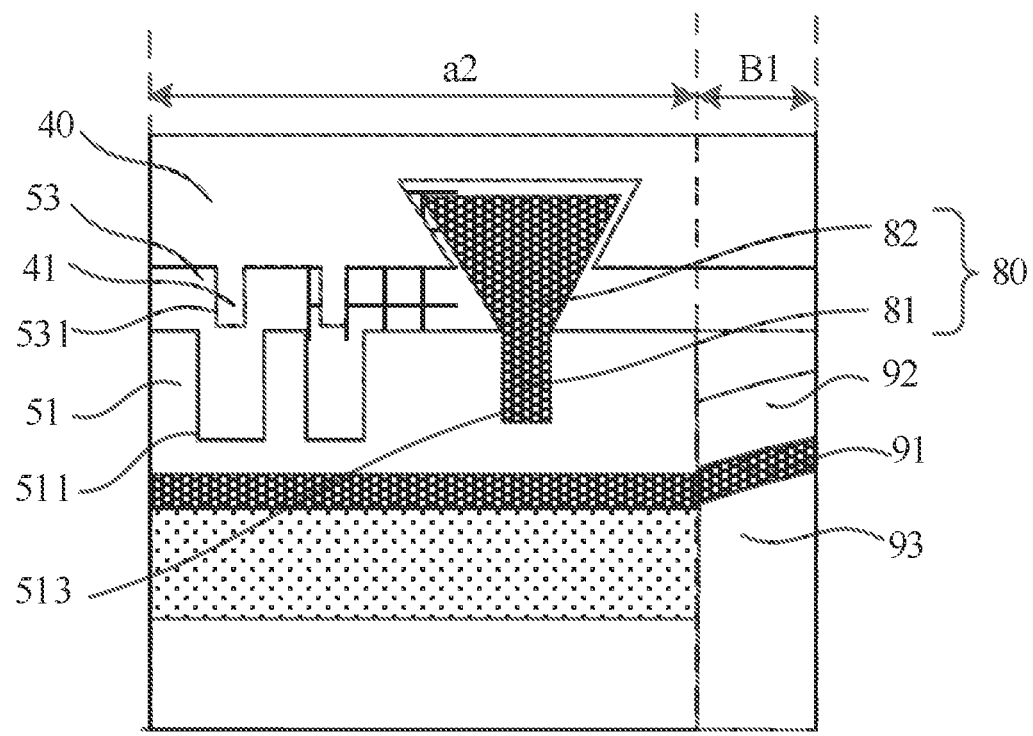
FIG. 16 is a schematic structural diagram of another encapsulation layer according to some embodiments of the present disclosure.

An orthogonal projection of the first protrusion 41 of the encapsulation layer 40 on the base 10 is located within an orthogonal projection of a corresponding first groove 511 of the dielectric layer 51 on the base 10, which means that: the orthogonal projection of the first protrusion 41 of the encapsulation layer 40 on the base 10 is located within an orthogonal projection of a corresponding second groove 531 of the etching protection layer 53 on the base 10, and the orthogonal projection of the second groove 531 of the etching protection layer 53 on the base 10 is located within the orthogonal projection of the corresponding first groove 511 of the dielectric layer 51 on the base 10. A height of the first protrusion 41 of the encapsulation layer 40 in the direction perpendicular to the base 10, i.e., a depth of the second groove 531 of the etching protection layer 53, may be set according to actual needs, for example, as shown in FIGS. 15 and 16.

In some embodiments, as shown in FIG. 9, the display substrate 1 further includes a base film 71 located on a surface, away from the encapsulation layer 40, of the base 10. The base film 71 is made of an elastic material, which is, for example, dimethyl siloxane, polyimide, PET, or other materials having high elasticity. The base film 71 may be able to protect the display substrate 1. For example, the base film 71 may be able to ensure that stretching deformations of the pixel regions A occur in a same plane when the display substrate 1 is stretched, and that the pixel regions A are accurately reset after the stretching, thereby improving the reliability of the stretchable display substrate during use. Optionally, the base film 71 is fixed on a surface of the base 10 facing away from the encapsulation layer 40 through an adhesive layer 72. The adhesive layer 72 is an OCA, which is made of an acrylic adhesive or a silicon adhesive.

The above descriptions are only specific implementations of the present disclosure, but the protection scope of the present disclosure is not limited thereto. Any person skilled in the art could conceive of changes of replacements within the technical scope of the present disclosure, which shall be included in the protection scope of the present disclosure. Therefore, the protection scope of the present disclosure shall be subject to the protection scope of the claims.

What is claimed is:

1. A display substrate having at least one display region and at least one non-display region, a non-display region being located at at least one side of a display region, the display substrate comprising:
    a base;
    a plurality of light-emitting devices located in the at least one display region and disposed on a side of the base; and
    an encapsulation layer disposed on a side, facing away from the base, of the plurality of light-emitting devices, and configured to encapsulate the plurality of light-emitting devices, wherein
    a surface, proximate to the base, of a portion of the encapsulation layer located in the non-display region is unevenly arranged;
    the display substrate further comprising a dielectric layer located in the at least one non-display region and disposed between the base and the encapsulation layer, wherein
    a surface, facing away from the base of a portion of the dielectric layer located in the non-display region has a plurality of first grooves, the surface, proximate to the base, of the portion of the encapsulation layer located in the non-display region has a plurality of first protrusions, the plurality of first protrusions are in one-to-one correspondence with the plurality of first grooves, and an orthogonal projection of each first protrusion on the base is located within an orthogonal projection of corresponding first groove on the base;

wherein the display substrate has a plurality of pixel regions and non-pixel regions, a non-pixel region is located at at least one side of a pixel region; the plurality of pixel regions are arranged in an array, and the pixel region includes the display region and the non-display region; the non-pixel region includes a connection region and an opening region;

the display substrate further comprises a plurality of signal connection lines located in the connection region and a plurality of signal control lines located in the pixel region; at least one end of each signal connection line is connected to at least one corresponding signal control line in at least one adjacent pixel region;

portions, located in opening regions, of the base, the encapsulation layer, and any thin film located between the base and the encapsulation layer are hollowed; portions, located in connection regions, of the encapsulation layer are located on a side, facing away from the base, of the plurality of signal connection lines.

2. The display substrate according to claim 1, wherein the non-display region is located between the display region and the connection region; the display substrate further comprises at least one barrier member located in the non-display region;

the at least one barrier member is disposed on a side, proximate to the base, of the encapsulation layer, and is configured to block a deformation crack from propagating from the connection region to the display region in a case where the deformation crack appears in a portion, located in the connection region, of the encapsulation layer.

3. The display substrate according to claim 2, wherein the surface, facing away from the base, of the portion of the dielectric layer located in the non-display region has at least one fixing groove, a fixing groove in the at least one fixing groove is matched with a barrier member in the at least one barrier member;

the barrier member includes a first sub-portion and a second sub-portion that are connected along a direction perpendicular to a surface of the base facing the encapsulation layer, wherein the first sub-portion is located in the fixing groove; the second sub-portion extends in a direction away from the first sub-portion; and a height of the second sub-portion in the direction perpendicular to the surface of the base facing the encapsulation layer is not less than a distance of a surface, proximate to the base, of the portion of the encapsulation layer located in the connection region from a surface of the second sub-portion proximate to the base in the same direction.

4. The display substrate according to claim 3, wherein an area of a cross-section of the second sub-portion taken along a plane parallel to the surface of the base facing the encapsulation layer gradually increases in a direction away from the base.

5. The display substrate according to claim 3, wherein a shape of a longitudinal section of the second sub-portion in a first direction is an inverted trapezoid, the first direction being a direction pointing from the non-display region to the connection region.

6. The display substrate according to claim 3, wherein the height of the second sub-portion in the direction perpendicular to the surface of the base facing the encapsulation layer is 2 μm to 4 μm.

7. The display substrate according to claim 2, wherein the at least one barrier member includes at least one loop-shaped barrier member; and an inner boundary of an orthogonal projection of the loop-shaped barrier member on the base is located outside of the display region.

8. The display substrate according to claim 1, further comprising:
at least one insulating layer located between the dielectric layer and the base, portions, located in the opening regions, of the at least one insulating layer being hollowed; and
an etching protection layer located between the dielectric layer and the encapsulation layer and covering at least a surface, proximate to the encapsulation layer, of the dielectric layer, the etching protection layer being configured to protect at least one thin film located outside of the opening regions from being etched away during a process of hollowing out the opening regions.

9. The display substrate according to claim 8, wherein a surface, facing away from the base, of a portion of the etching protection layer located in the non-display region has a plurality of second grooves, the plurality of second grooves are in one-to-one correspondence with the plurality of first protrusions of the encapsulation layer, and each first protrusion is located in a corresponding second groove.

10. The display substrate according to claim 1, further comprising a first signal line protection layer and a second signal line protection layer that are disposed on both sides of the plurality of signal connection lines in a direction perpendicular to a surface of the base facing the encapsulation layer, the first signal line protection layer and the second signal line protection layer being both made of an organic material.

11. The display substrate according to claim 10, wherein the second signal line protection layer is located on a surface, proximate to the base, of the plurality of signal connection lines;
the display substrate further comprises a barrier layer located between the base and the second signal line protection layer;
the barrier layer is made of an inorganic material, and a thickness of a portion of the barrier layer located in the connection region is less than a thickness of a portion of the barrier layer located in the pixel region.

12. The display substrate according to claim 11, wherein the portion of the barrier layer located in the connection region has a third groove, and the second signal line protection layer is located in the third groove; a depth of the third groove is less than or equal to the thickness of the portion of the barrier layer located in the pixel region.

13. The display substrate according to claim 1, further comprising a base film, wherein the base film is made of an elastic material; and the base film is fixed on a surface of the base facing away from the encapsulation layer through an adhesive layer.

14. The display substrate according to claim 1, wherein each first protrusion of the encapsulation layer is located in one corresponding first groove.

15. The display substrate according to claim 1, wherein a depth of the first groove is 70% to 100% of a thickness of the dielectric layer.

16. The display substrate according to claim 1, wherein at least one of the first grooves is a loop-shaped groove, and a first protrusion in the first protrusions corresponding to the loop-shaped groove is a loop-shaped protrusion.

17. The display substrate according to claim 1, wherein the dielectric layer is made of an insulating material.

18. A display device, comprising the display substrate according to claim 1.

* * * * *